(12) United States Patent
Scuderi et al.

(10) Patent No.: US 7,358,807 B2
(45) Date of Patent: Apr. 15, 2008

(54) PROTECTION OF OUTPUT STAGE TRANSISTOR OF AN RF POWER AMPLIFIER

(75) Inventors: Angelo Scuderi, Catania (IT);
Antonino Scuderi, Misterbianco (IT);
Luca La Paglia, Caltagirone (IT);
Francesco Carrara, Acireale (IT);
Giuseppe Palmisano, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 112 days.

(21) Appl. No.: 11/361,238

(22) Filed: Feb. 24, 2006

(65) Prior Publication Data
US 2006/0197594 A1 Sep. 7, 2006

(30) Foreign Application Priority Data
Feb. 25, 2005 (EP) .................................. 05425097

(51) Int. Cl.
*H03G 3/20* (2006.01)

(52) U.S. Cl. ..................................... 330/140; 330/279
(58) Field of Classification Search ................ 330/140, 330/279, 207 P, 298
See application file for complete search history.

(56) References Cited

U.S. PATENT DOCUMENTS

| 3,866,136 A | 2/1975 | Augustin et al. ........ 330/207 P |
| 4,122,400 A | 10/1978 | Medendorp et al. ..... 330/207 P |
| 5,128,629 A * | 7/1992 | Trinh .......................... 330/129 |
| 5,376,895 A * | 12/1994 | Aihara ......................... 330/129 |
| 5,432,473 A * | 7/1995 | Mattila et al. .............. 330/133 |
| 5,606,285 A * | 2/1997 | Wang et al. ................. 330/134 |
| 2002/0125945 A1 | 9/2002 | Taylor ......................... 330/129 |

FOREIGN PATENT DOCUMENTS

WO 02/065634 8/2002

OTHER PUBLICATIONS

Scuderi et al., Institute of Electrical and Electronics Engineers, A High Performance RF Power Amplifier with Protection Against Load Mismatches, 2003 IEEE MTT-S International Microwave Symposium Digest, vol. 3 of 3, Jun. 8, 2003, pp. 699-702.

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A protection method may prevent a load-mismatch-induced failure in solid-state power amplifiers. In an RF power amplifier, the load voltage standing-wave ratio results in very high voltage peaks at the collector of the final stage and may eventually lead to permanent failure of the power transistor due to avalanche breakdown. The method avoids breakdown by attenuating the input power to the final stage during overvoltage conditions, thus limiting the output collector swing. This is accomplished by a feedback control system, which detects the peak voltage at the output collector node and clamps its value to a given threshold by varying the circuit gain. Indeed, the control loop is unlocked in the nominal condition and it acts when an output mismatching condition is detected. A control circuit also allows a supply-independent collector-clamping threshold to be accurately set.

18 Claims, 9 Drawing Sheets

PROTECTION OF OUTPUT STAGE TRANSISTOR OF AN RF POWER AMPLIFIER

FIELD OF THE INVENTION

The present invention relates to the field of electronics, and, more particularly, to radio frequency (RF) power amplifiers and associated methods.

BACKGROUND OF THE INVENTION

Modern cellular radio mobile communication systems may impose power efficiency and ruggedness specifications that cause exceptional technical problems to the designers of the RF transmission circuits. A typical example of these systems is GSM, where the mobile equipment is not allowed a permanent failure even under a severe load impedance mismatch. In most commercial GSM mobile equipment, worst-case mismatch conditions are determined by two customary system features.

First, no voltage regulator is used between the battery cells and the power amplifier. A higher than 2 watt output power level is required for GSM power amplifiers, which implies a strong current consumption. In such conditions, the use of a linear voltage regulator would result in excessive power losses due to large voltage drops, unless an application-specific regulator was properly tailored to the equipment. As far as efficiency is concerned, switching-mode voltage regulators offer better performance than linear ones, but the output power spectrum may be seriously compromised by spurious tones resulting from a residual ripple on the supply voltage. Therefore, direct connection of the battery cells to the power amplifier (PA) supply terminal has become the most commonly adopted approach for GSM systems. The drawback with this approach is that an over-supply condition occurs each time the mobile handset is put in the battery-charge state. In fact, a supply voltage as high as 5 V is provided to the power amplifier by fast battery chargers.

Moreover, no isolator is typically used between the PA and the antenna. As a result, the PA can incur strong load mismatch conditions due to antenna faults or disconnection. Power transistors should therefore be able to tolerate substantially increased overvoltage stress, as collector voltage waveforms show much higher peaks under mismatch conditions than in nominal operation.

Figure 1:
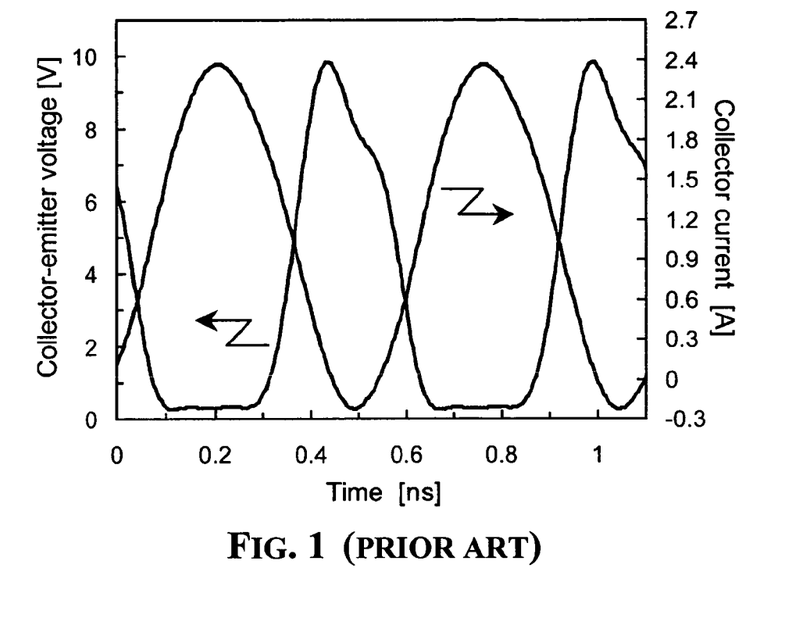
FIG. 1 shows simulated collector waveforms under nominal 50 Ω load matching conditions ($V_{CC}$=3.5 V, f=1.8 GHz, $P_{out}$=34 dBm) as in the prior art.
Figure 2:
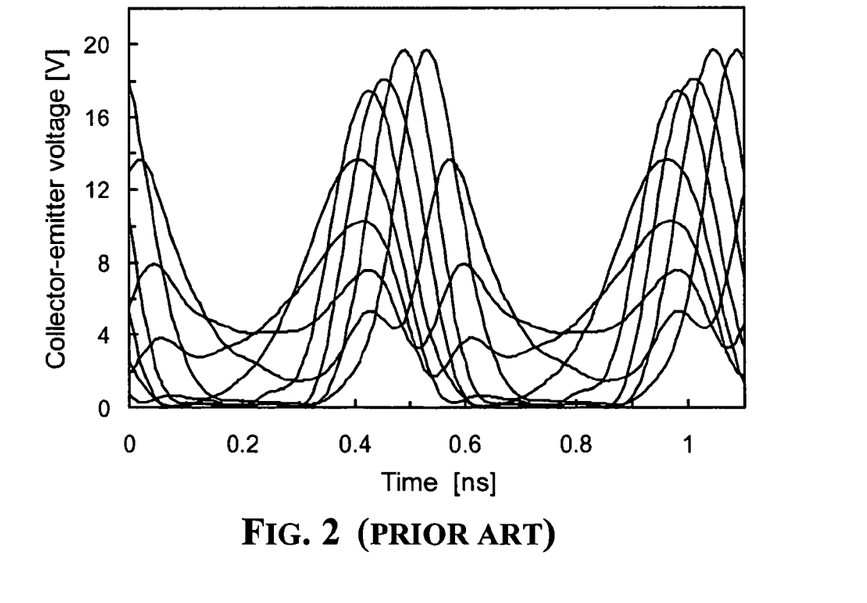
FIG. 2 shows simulated collector-emitter voltage waveforms under worst-case mismatch conditions for different load reflection phase angles (10:1 load VSWR, $V_{CC}$=5 V, f=1.8 GHz) as in the prior art.

The worst-case conditions occur when the power amplifier is subject both to oversupply and load mismatch. For this reason, the ruggedness specification is usually expressed in terms of a maximum tolerable output VSWR under a specified oversupply condition. Typical data sheets of commercial power amplifiers guarantee that no permanent damage is caused by a load VSWR of 10:1 under a supply voltage of 5 V. Simulated collector waveforms are shown in FIGS. 1 and 2 for a 34 dBm output power stage under nominal ($V_{CC}$=3.5 V, matched load) and worst-case ($V_{CC}$=5V, 10:1 load VSWR) operating conditions, respectively. Considerable collector voltage peaks as high as 20 V are attained, indicating that active devices with a very high breakdown voltage are needed.

The maximum operating region of silicon bipolar transistors has recently been investigated and their breakdown behavior experimentally compared to GaAs heterojunction bipolar transistors (HBTs) as disclosed in A. Inoue, S. Nakatsuka, R. Hattori, and Y. Matsuda, "The maximum operating region in SiGe HBTs for RF power amplifiers," in IEEE MTT-S Int. Microwave Symp. Dig., June 2002, pp. 1023-1026. The ability of silicon bipolar devices to operate with collector peaks beyond the nominal (dc) breakdown voltage has been demonstrated, whereas GaAs HBTs cannot survive such a test. Despite this, too high breakdown voltages (i.e., more than three times the maximum supply voltage) are still required for silicon BJTs to comply with commercial ruggedness specifications. This is quite a difficult challenge, especially for transistors optimized to attain best power performance in low-voltage operation. Indeed, breakdown voltage enhancements are only possible by reducing the doping level and/or increasing the thickness of the collector layer, which has a detrimental effect on the power-added efficiency (briefly PAE) due to greater losses on the collector series resistance. Therefore, some kind of circuit arrangement may be needed to improve device ruggedness.

Figure 3:
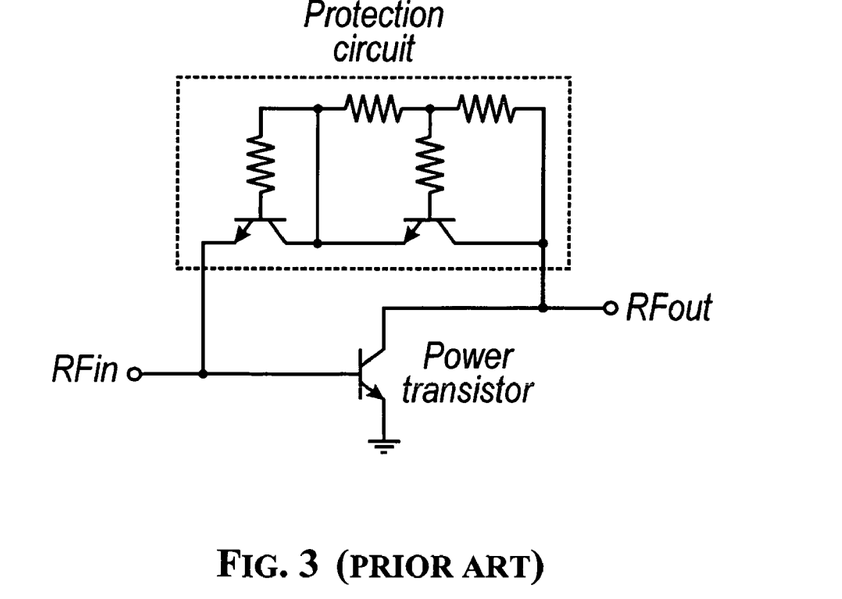
FIG. 3 is a common VSWR protection circuit using $V_{BE}$ multipliers for collector voltage clamping as in the prior art.
Figure 4:
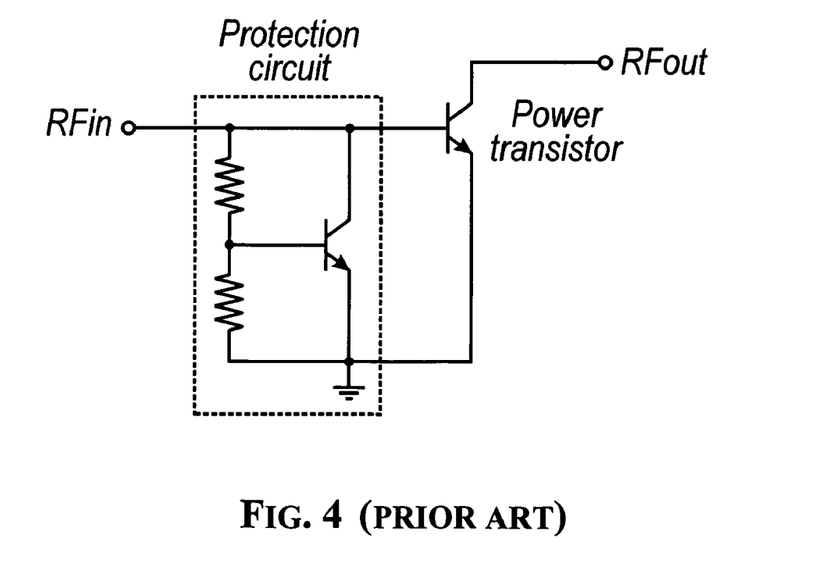
FIG. 4 is another common VSWR protection circuit using $V_{BE}$ multipliers for base voltage clamping as in the prior art.

Circuital approaches have been proposed in literature, which allow VSWR protection by clamping the voltage peaks either at the collector or base of the power transistor. In K. Yamamoto et al., "A 3.2-V operation single-chip dual-band AlGaAs/GaAs HBT MMIC power amplifier with active feedback circuit technique," IEEE J. Solid-State Circuits, vol. 35, pp. 1109-1120, August 2000, a $V_{BE}$ multiplier is effectively used to limit the collector voltage swing, as shown in FIG. 3. When the collector-base voltage of the power transistor exceeds the turn-on voltage of the $V_{BE}$ multiplier, a large current flows through the protection circuit and the collector voltage is prevented from reaching the breakdown limit. Conversely, in J. R. King, "High VSWR mismatch output stage," U.S. Pat. No. 6,137,366, Oct. 24, 2000, a $V_{BE}$ multiplier senses the base-emitter voltage of the power transistor, as shown in FIG. 4. A portion of the base current is absorbed by the additional circuitry when the base-emitter voltage exceeds a certain threshold. Therefore, the collector current of the active device is limited and secondary breakdown is avoided.

The use of clamping protection circuits may result in RF performance degradation. Indeed, base voltage clamping limits full input overdrive of the power transistor, whereas collector clamping hampers a proper waveform shaping through harmonic manipulation as disclosed in F. H. Raab, "Class-F power amplifiers with maximally flat waveforms," IEEE Trans. Microwave Theory Tech., vol. 45, pp. 2007-2012, November 1997. Input overdrive and waveform shaping are both crucial to achieve high-PAE operation.

Figure 6:
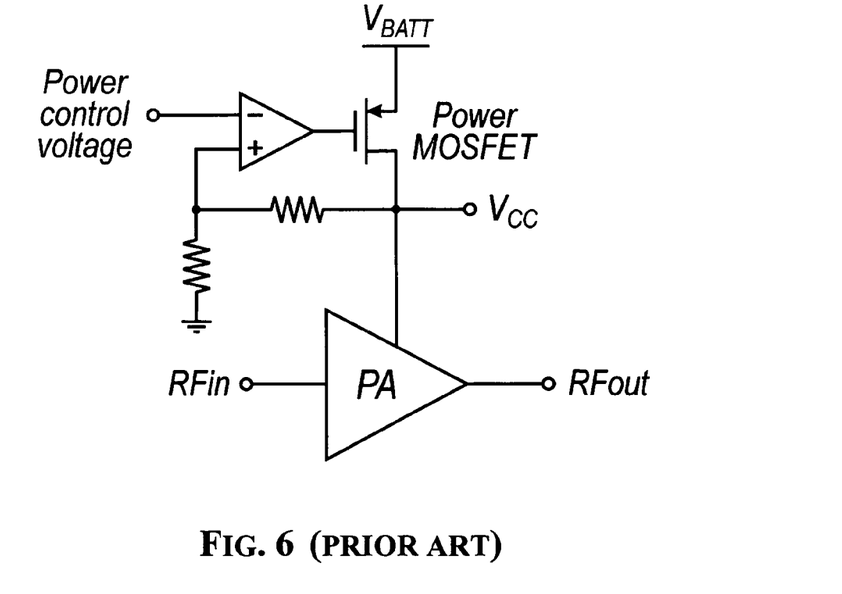
FIG. 6 illustrates a common supply voltage regulation approach as in the prior art.

A 30 dB transmit power control range may be needed in the GSM system to optimize the propagation link budget. In most commercial GSM mobile equipment the power control is performed by a closed-loop approach as disclosed in P. Cusinato, "Gain/bandwidth programmable PA control loop for GSM/GPRS quad-band cellular handsets," IEEE J. Solid-State Circuits, vol. 39, pp. 960-966, June 2004. As shown in FIG. 6, the RF power is sensed at the amplifier output using a directional coupler and is detected by a diode. The resulting signal is compared to a reference voltage through an error amplifier whose output drives the PA gain control terminal. The loop forces the sensed voltage and the reference voltage to be equal. Therefore, power control can be accomplished by changing the reference voltage.

The main drawback of the closed-loop approach is the output power loss due to the directional coupler, which strongly affects the overall efficiency of the transmit chain. Moreover, the loop gain varies considerably over the dynamic range because of the nonlinear control characteristic of the PA. As a consequence, the control of power regulation transients may be made difficult and the system may even suffer from stability problems.

An alternative approach has been proposed in D. Brunel et al., "Power control with the MRFIC0913 GaAs IPA and MC33169 support IC," Motorola Semiconductors application note AN1599, 2000. Available online at: http://e-www.motorola.com/files/rf_if/doc/app_note/AN1599.pdf. The reference discloses an approach which acts on the PA's supply voltage to control the output power of the amplifier, as shown in FIG. 6. By using a simple linear regulator (implemented through a power PMOS transistor and an operational amplifier), the PA collector voltage can be linearly varied through a control terminal. Reducing the collector voltage effectively limits the output swing and, hence, the power delivered. This technique allows for excellent power-setting accuracy without the need for closed-loop output power sensing. The implementation of a tailored supply voltage regulator (sometimes embedded in the PA module) eliminates the need for the complex and lossy external circuitry required for a closed-loop approach, including the directional coupler, power detector, and error amplifier. However, a very low $R_{DS(ON)}$ (not higher than a few tens of milliohms) is needed for the PMOS transistor to preserve the overall efficiency under maximum output power conditions. Therefore, an extra-cost is entailed for the use of such a high-performance device.

Another drawback impairs the above-mentioned open-loop approach. A nearly linear relationship between the collector dc voltage and the RF output voltage is obtained when regulating the power supply level. This is particularly true for FET-based switching PAs (e.g., Class E amplifiers as disclosed in N. O. Sokal and A. D. Sokal, "Class E—A new class of high-efficiency tuned single-ended switching power amplifiers," IEEE J. Solid-State Circuits, vol. SC-10, pp. 168-176, June 1975). Such a linear control characteristic turns to logarithmic when expressed in dB/V units. It thus suffers from a very steep control slope at low power levels, which calls for an increased resolution of the digital-to-analog converter driving the gain control terminal.

The document EP-1,387,485-A1 discloses an RF power amplifier including an external control loop and a protection circuit. In the external loop a collector current from the output transistor is detected and regulated in respect to a reference current. The protection circuit detects a voltage envelope at the collector electrode of the output transistor and utilizes this signal for a bias reduction signal that is input to the base electrode of the driver transistor.

Another closed-loop approach to limit the output of the last stage of an RF power amplifier to protect it against high voltages that could lead to a destructive breakdown of the output power transistor is disclosed in the document WO 03/034586 A1. The collector voltage of the output transistor is sensed through an AC coupled resistive voltage divider and compared with a threshold value for eventually reducing the base current of the output power transistor. A control voltage $V_{control}$ commands both the turning on of a biasing circuit of the output power transistor and a switch for isolating the collector voltage sensing network to prevent undue dissipation.

A drawback of this approach may be the inability to adjust the threshold that determines the intervention of the attenuating control in function of the detected peak levels of the output voltage (the collector voltage of the output power transistor). Moreover this approach exploits a control loop, which is always locked. This could be a potential source of instability, especially in modern wide-band applications.

Moreover overall energy efficiency may be enhanced by switching off all current generators with a single external command to eliminate any current absorption when the amplifier is in an off state without employing a dedicated switch for isolating the output sensing network.

SUMMARY OF THE INVENTION

The above noted drawbacks and other significant improvements of the reliability of VSWR protection of the output stage of an RF power amplifier are achieved by allowing adjustment of the reference threshold voltage, the surpassing of which by the amplitude of the envelope of the RF signal output by the power stage produces a feedback control current of the output RF voltage that reduces the gain of the driver stage of the output power stage of the amplifier.

According to one aspect of the protection circuit, the reference threshold voltage is set by an externally applied regulating voltage and by processing it to compensate for possible intervening changes of the supply voltage. Most preferably, the reference threshold voltage so programmed is also temperature compensated for further enhancing the reliability of the protection.

DETAILED DESCRIPTION OF THE PREFERRED EMBODIMENTS

Figure 7:
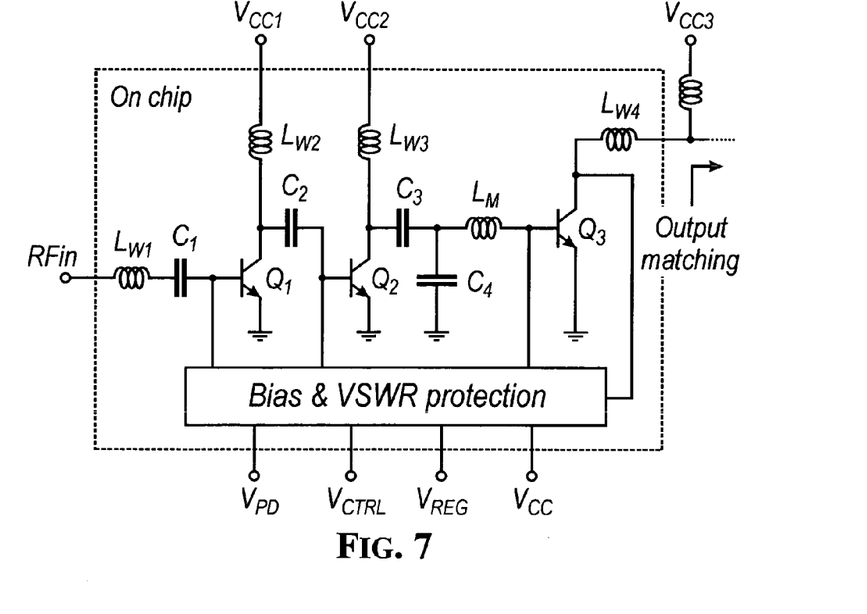
FIG. 7 is a basic scheme of protected PA according to the invention.

A simplified diagram of an RF power amplifier (briefly PA) according to a sample embodiment is shown in FIG. 7. The circuit includes three stages ($Q_1$-$Q_3$) Based on load-pull measurements, two elementary power cells were paralleled to implement the first stage, seven cells were used for the-second stage, and twenty-eight cells for the third.

In GSM and DCS systems, transmitter linearity requirements are a minor issue due to the constant-envelope modulation scheme adopted. Therefore, high-efficiency operation classes, such as disclosed in F. H. Raab, "Class-F power amplifiers with maximally flat waveforms," *IEEE Trans. Microwave Theory Tech.*, vol. 45, pp. 2007-2012, Nov. 1997, can be exploited for PA design. In the embodiment considered, a series-resonant load was used to improve PA efficiency as disclosed in F. Carrara, T. Biondi, A. Castorina, A. Scuderi, and G. Palmisano, "A 1.8-GHz high-efficiency 34-dBm silicon bipolar power amplifier," *IEEE Trans Microwave*. Indeed, bond-wire inductance $L_{W4}$ and a partially distributed output matching network were properly employed to provide a high reactive impedance for the harmonics of the fundamental frequency. Such a load leads to a pulsed collector voltage and a sinusoidal collector current (mixed-C mode as disclosed in H. L. Krauss, C. W. Bostian, and F. H. Raab, *Solid State Radio Engineering*, New York: Wiley, 1980 or Class C-E as disclosed in F. J. Ortega-Gonzälez, J. L. Jimenez-Martin, and A. Asensio-López, "Effects of matching on RF power amplifier efficiency and output power," *Microwave J.*, vol. 41, no. 4, pp. 60-72, April 1998). Dual waveforms, i.e., a pulsed current and sinusoidal voltage, are generated when a parallel-resonant load is used. However, this produces a higher current peak, which results in an increased voltage drop across the collector series resistance, and, hence, a reduction in PAE.

The amplifier was integrated using a silicon bipolar technology with 6.4-V $BV_{CEO}$. The on-chip inter-stage matching networks were designed for maximum gain under large-signal conditions. The goal of maximum bandwidth was also considered for the inter-stage matching to compensate for device process tolerances. A bond-wire inductance ($L_{W2}$) and a capacitor ($C_2$) were used between the first and second stages, whereas two capacitors ($C_3$, $C_4$), a bond-wire inductance ($L_{W3}$), and a spiral inductor ($L_M$) were employed between the second and third stages. An off-chip pull-up inductor was used to bias the final stage collector. Capacitor $C_1$ provides dc decoupling for $Q_1$.

Since the transistor's transit frequency is much higher than the operating frequency, the small-signal gain of the common-emitter amplifier stages is mainly limited by the parasitic feedback due to the emitter inductance $L_E$ and base-collector capacitance $C_{BC}$. Indeed, the power gain can be approximated by the following simple expression as disclosed in P. H. C. Magnée et al., "Enhanced rf power gain by eliminating the emitter bondwire inductance in emitter plug grounded mounted bipolar transistors," in Proc. IEEE Bipolar/BiCMOS.

$$G_P \cong \frac{1}{\omega^2 L_E C_{BC}} \quad (1)$$

where $\Omega=2\pi$ f is the operating frequency. Design optimization can only be carried out on $L_E$, because $C_{BC}$ is a technology-dependent parameter.

In practice, even small amounts of emitter parasitic inductance can seriously compromise the gain of the amplifier stages. Therefore, minimizing ground inductance is a primary goal when designing RF PAs. For this purpose, both the second and third stages were endowed with large on-chip ground planes by using a third metal layer. Moreover, a solderable-pad package was selected for circuit assembly and a large number of down-bonding wires was used to connect the on-chip ground planes to the die pad. Extensive electromagnetic simulations were performed to accurately estimate ground inductances at the operating frequency and its harmonics. ADS Momentum was employed for 2-D simulations of the ground planes, whereas Ansoft HFSS was used for 3-D simulations of downbonding wires. Ground inductances values below 0.1 nH were estimated.

A bias circuit enabling a power control function and a VSWR-protection loop according to this invention will now be described with reference to detailed circuit diagrams of the illustrated embodiment.

A power-down functionality is implemented. When the logic input $V_{PD}$ of the basic scheme of FIG. 7 is pulled to a low voltage level, the circuit is shut down by slaving all current generators of the bias circuit to the external logic command $V_{PD}$ and current consumption of the whole PA becomes lower than 10 µA.

Bias Circuitry and Output Power Control

An open-loop power control approach is used, based on varying the PA quiescent current the external voltage $V_{CTRL}$.

According to measurements as disclosed in F. Carrara, T. Biondi, A. Castorina, A. Scuderi, and G. Palmisano, "A 1.8-GHz high-efficiency 34-dBm silicon bipolar power amplifier," *IEEE Trans. Microwave Theory Tech.*, vol. 50, pp. 2963-2970, December 2002, a linear dependence of the bias current on $V_{CTRL}$ is not suitable for minimizing the power control slope. Indeed, a higher increase rate is needed to comply with this requirement. An exponential law is exploited to implement a soft-slope power control characteristic. This is achieved by using the bias network outlined in FIG. 8 (single-stage representation), whose operating principle is detailed herein below.

Figure 8:
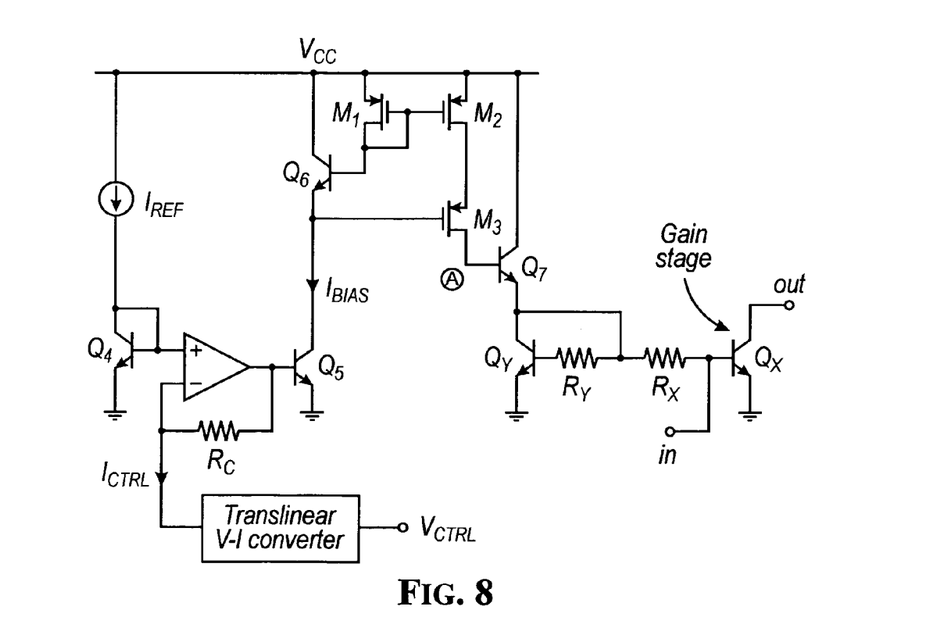
FIG. 8 is a single-stage representation of the bias network of a preferred embodiment of the PA of the invention.

Assuming that high-injection effects on $Q_5$ can be neglected, collector current $I_{BIAS}$ follows the exponential law $$\begin{aligned} I_{BIAS} &= I_{C5} \\ &= \alpha_F J_{ES} A_{E5} \exp\left(\frac{V_{BE5}}{V_T}\right) \\ &= \frac{A_{E5}}{A_{E4}} I_{REF} \exp\left(\frac{R_C I_{CTRL}}{V_T}\right) \end{aligned} \quad (2)$$

If the control current $I_{CTRL}$ exhibits a linear dependence on the control voltage $V_{CTRL}$, then an exponential biasing characteristic is achieved. In order to achieve temperature compensation, reference current $I_{REF}$ has to be temperature-stable and control current $I_{CTRL}$ has to be proportional to a $V_T/R$. The latter condition may be fulfilled by employing a gain control circuit as shown in FIG. 9.

Figure 9:
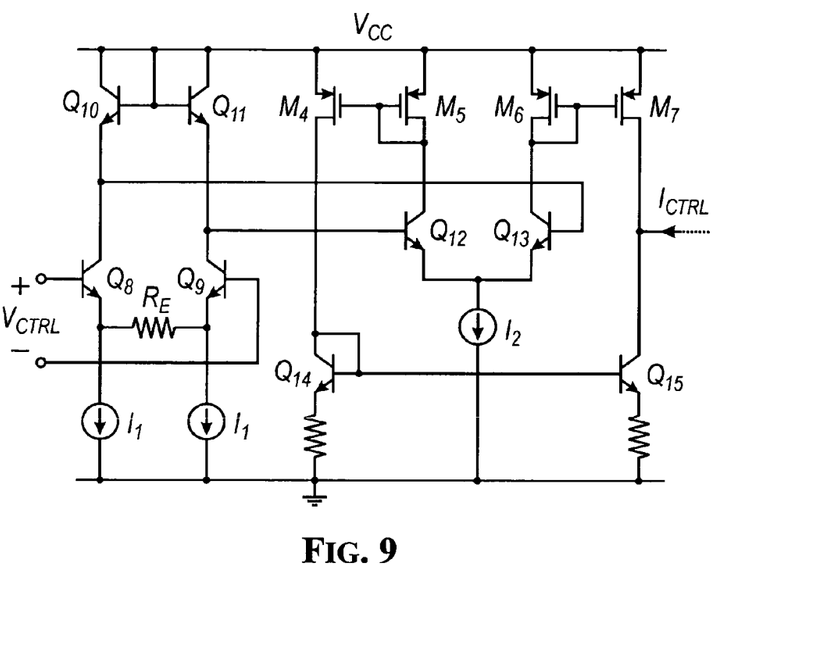
FIG. 9 shows a translinear V-I converter providing temperature compensation to the bias network according to the invention.

The circuit of FIG. 9 is a translinear V-I converter whose bipolar output current is given by $$I_{CTRL} = \frac{1}{R_E} \frac{I_2}{I_1} V_{CTRL} \tag{3}$$

where currents $I_1$ and $I_2$ can be easily generated with the following temperature dependences $$I_1 \propto \frac{V_{band\text{-}gap}}{R}, I_2 \propto \frac{V_T}{R} \tag{4}$$

In this manner, $I_{CTRL}$ assumes a $V_T/R$-like behavior and an effective temperature stabilization of current $I_{BIAS}$ is achieved.

The temperature independent $I_{BIAS}$ sets the collector quiescent current of the gain stage through a pair of current mirrors, namely $Q_6$-$Q_7$ and $Q_X$-$Q_Y$.

Mirror $Q_6$-$Q_7$ (also comprising transistors $M_1$ through $M_3$) occupies less silicon area than PMOS-only topologies. The MOS transistors are used to mirror the base current of $Q_6$ instead of its emitter current (i.e., $I_{BIAS}/\beta_{F6}$ instead of $I_{BIAS}$). This represents a substantial advantage since normally available PMOS transistors exhibit quite low transconductance values (10 μm gate width for a 0.3-V $V_{DSsat}$ at a 15 μA drain current) and, therefore, relatively large devices would be required to manage mA-level currents.

The exponential biasing scheme described above is used for the first and second stage of the PA, whereas a fixed-current Class-AB biasing is used for the final stage.

In addition to the soft-slope benefit, the bias circuit also offers a cost-effective alternative to the use of prior-art output power control approaches, since it eliminates the extra-cost entailed by the use of discrete components (mainly the directional coupler for the closed-loop approach and the power PMOS transistor for the open-loop scheme as already discussed). Moreover, higher efficiency is achieved since off-chip power losses are avoided. Finally, the bias circuit makes transmit burst shaping easier because it exploits an open-loop approach, which is inherently stable.

Closed-Loop Output Peak Voltage Control

Provided that the available fabrication process exhibits a higher than 5 V $BV_{CEO}$, the battery-charge oversupply condition is not enough in itself to cause the breakdown of active devices. Permanent failure occurs only if a substantial RF voltage swing adds to the high 5-V dc component at the collector node, i.e., when the sum of the two contributions exceeds the physical limits of the device.

The risk of breakdown can be prevented by attenuating the RF signal driving the final stage during overvoltage conditions. This is accomplished by a feedback control system, which detects the peak voltage at the output collector node and clamps its value to a specific threshold by varying the amplifier gain.

Figure 10:
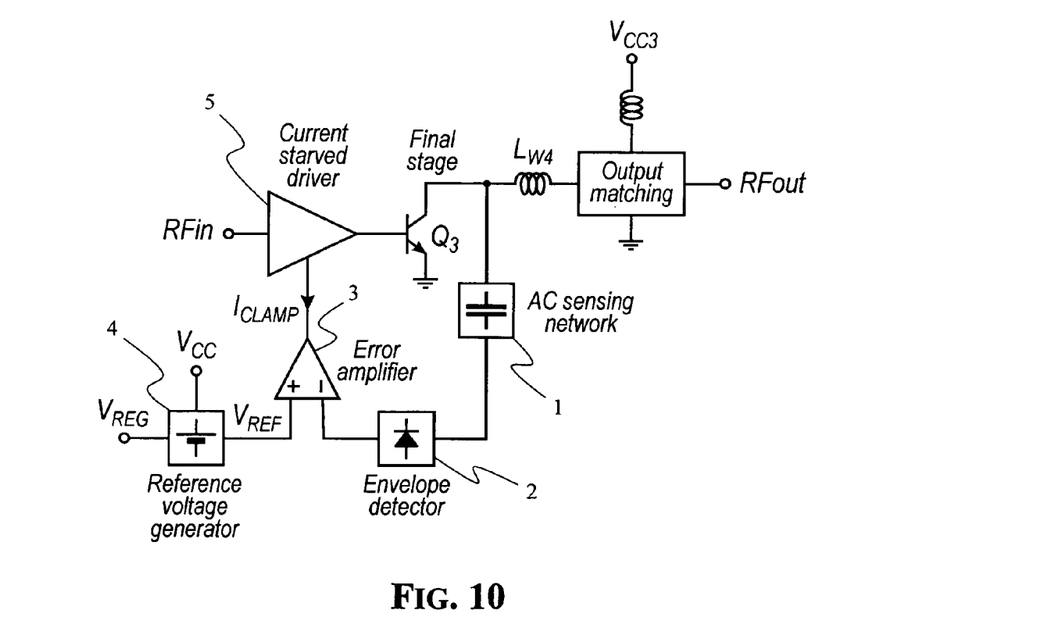
FIG. 10 is a block diagram of the VSWR protection loop for collector peak voltage control of the invention.

As schematically represented in FIG. 10, the collector voltage of the output Q3 transistor is scaled down by means of an AC-coupled high-input-impedance sensing network (1), which has a minor loading effect on the power stage thereby preserving the nominal power performance. The scaled-down voltage is applied to an envelope detector (2) delivering an output signal proportional to the collector peak voltage. An error amplifier (3) compares the rectified waveform output by the envelope detector (2) with a reference threshold voltage $V_{REF}$. The output error current $I_{CLAMP}$ is used to decrease the quiescent current of the driver stage (5).

Under normal operation, $I_{CLAMP}$ is zero and the driver stage bias current is at its maximum design value. When an overvoltage condition is detected at the output, the loop reduces the driver quiescent current thus limiting the amplifier gain. In this manner, the maximum swing at the collector of the final stage transistor Q3 is clamped to a safe peak voltage, set by reference threshold voltage $V_{REF}$.

According to an aspect of this circuit, the reference threshold voltage $V_{REF}$ is programmed by the external threshold regulating voltage $V_{REG}$ (re: FIG. 7) and is not constant, but is compensated for possible changes of the supply voltage $V_{CC}$ within the reference voltage generating circuit (4).

Because of the high collector voltage peaks that may occur under mismatch conditions, the use of a resistive divider may be needed to enable breakdown-safe voltage sensing. Moreover, an AC coupling capacitor C5 is used between the collector node of the final stage and the resistive divider to prevent DC current consumption under power-down conditions. The AC coupling makes the loop insensitive to the DC component of the collector voltage waveform, i.e., insensitive to possible supply variations. This is corrected by applying the supply voltage compensated reference threshold voltage $V_{REF}$ to the relative input node of the error amplifier (3). Therefore, a supply-independent collector clamping threshold voltage $V_{REF}$ is set by using a reference threshold voltage generator, externally controlled through a threshold setting voltage $V_{REG}$, that in addition gradually reduces $V_{REF}$ as $V_{CC}$ increases.

Figure 11:
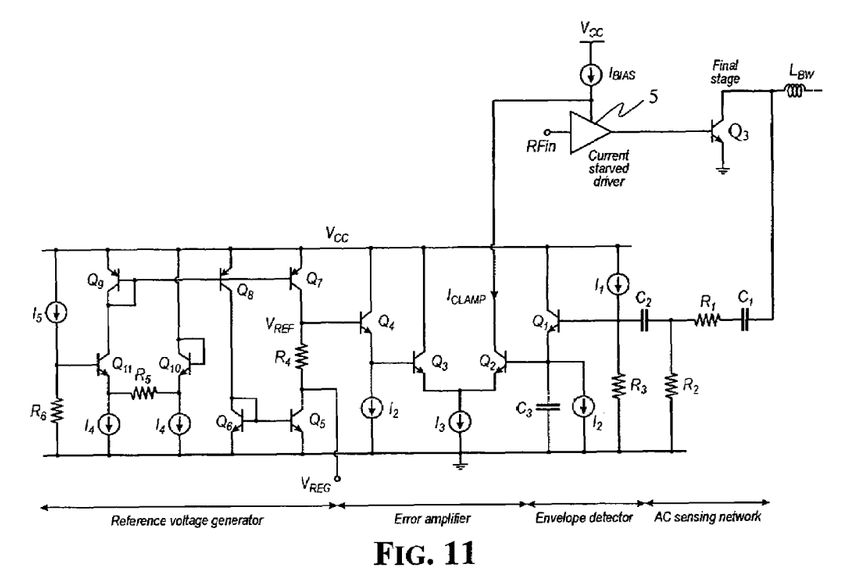
FIG. 11 is a detailed circuit diagram of the feedback path of the VSWR-protection loop according to the invention.

An effective circuit embodiment of such a reference threshold voltage generator is shown in the right hand portion of the feedback path of the VSWR loop of FIG. 11.

If $R_3 >> R_2$ and capacitors $C_5$ and $C_6$ are large enough to be considered short circuits at the operating frequency, then the output voltage of rectifier $Q_{16}$ can be expressed as $$V_{B17} = \frac{R_2}{R_1 + R_2}(V_{C3(peak)} - V_{CC}) + R_3 I_3 - V_{BE16} \tag{5}$$

Moreover $$V_{B18} = V_{REF} - V_{BE19} \tag{6}$$

Under locked conditions the loop sets the same voltage level at both the inputs of the error amplifier (i.e., $V_{B\_17} = V_{B\_18}$). Assuming equal voltage drops across the base-emitter junctions of $Q_{16}$ and $Q_{19}$, equations (5) and (6) lead to $$V_{C3(peak)} = V_{CC} + \frac{R_1 + R_2}{R_2}(V_{REF} - R_3 I_3) \tag{7}$$

Provided that the reference voltage generator in FIG. 11 is designed according to the following conditions $$\frac{R_2}{R_1 + R_2} = \frac{R_4}{R_5} \frac{(W/L)_8}{(W/L)_{10}} \tag{8}$$

-continued $$R_3 I_3 = \frac{R_2}{R_1 + R_2}(R_5 I_6 + R_6 I_7) \qquad (9)$$

$$\frac{(W/L)_8}{(W/L)_9} = \frac{A_{E20}}{A_{E21}} \qquad (10)$$

then $$V_{REF} = V_{REG} + R_3 I_3 - \frac{R_2}{R_1 + R_2} V_{CC} \qquad (11)$$

Finally, substituting (11) into (7) gives $$V_{C3(peak)} = \left(1 + \frac{R_1}{R_2}\right) V_{REG} \qquad (12)$$

Equation (12) confirms that the reference threshold voltage generator provides a supply-independent clamping threshold voltage for the collector voltage of the final stage ($Q_3$) as set by the external voltage $V_{REG}$.

Figure 5:
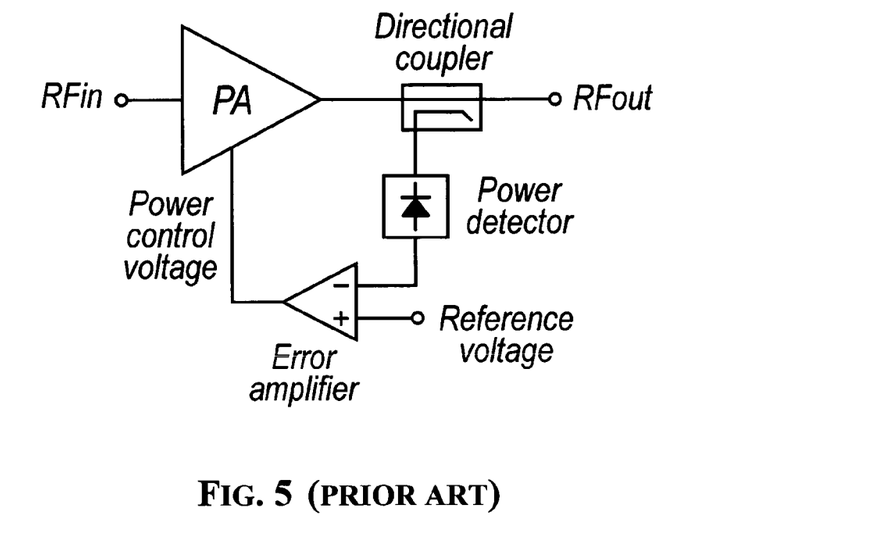
FIG. 5 illustrates a traditional output power closed-loop control approach as in the prior art.

Though being apparently equivalent in functional terms to the common feedback scheme outlined in FIG. 5, the architecture of the feedback path of the protection circuit shown in FIG. 10, is based on a completely different operating principle. The architecture enables a collector voltage peak control, whereas only the amplitude of the collector fundamental tone was regulated by the prior art power control technique of FIG. 5. Indeed, significant collector peaks are due to the harmonic components of the voltage waveforms (mainly second harmonic), which are filtered off by bond-wire inductance $L_{W4}$ and the output matching network when using an off-chip peak detector. Therefore, the sensed voltage is no longer proportional to the actual collector peak.

Moreover, the feedback loop for the output power control of this circuit remains permanently active, though the peak voltage control only intervenes when a critical condition occurs. During normal operating conditions (i.e., when the collector envelope is below the limit set by $V_{REG}$), the gain saturates to its maximum value and the loop opens.

The enhanced protection afforded by the circuit effectively prevents power transistor failure without compromising the PA's efficiency. The control loop is open under nominal operating conditions and the loading effect of the sensing network on the final stage is negligible.

Experimental Results

Figure 12:
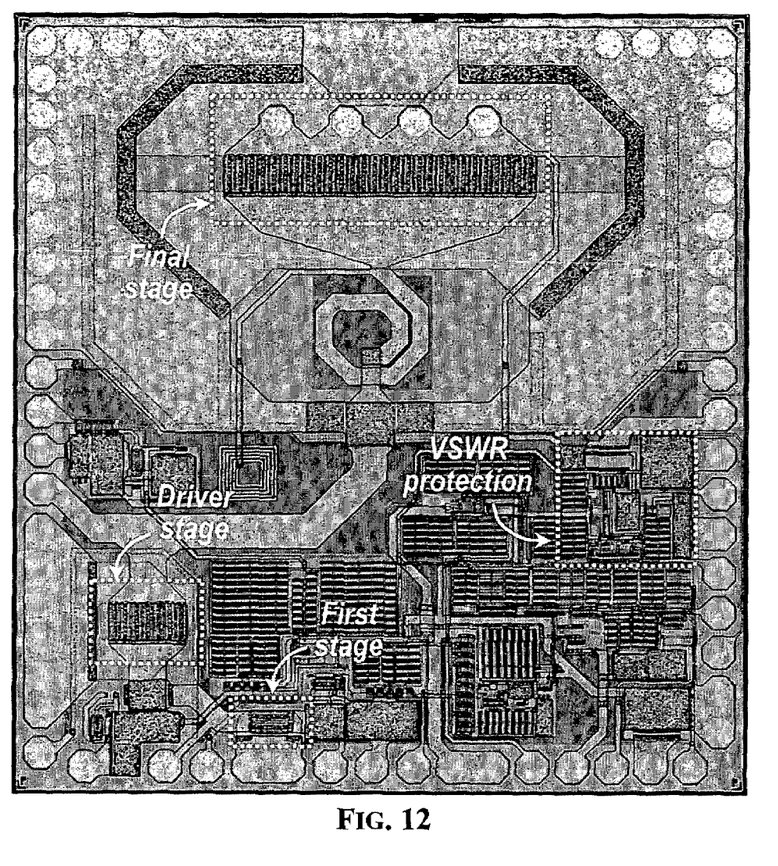
FIG. 12 is a die photograph of the VSWR protected PA of the illustrated embodiment of the invention.

A die photograph of the fabricated PA is shown in FIG. 12. The chip size is 1.66 mm×1.8 mm. The die was assembled in a small 16-pin leadless plastic package endowed with an exposed bottom pad for improved RF grounding and heat dissipation. Package size is 4×4×0.9 mm. Measurements were performed on a 400-μm-thick FR4 substrate. A semi-lumped approach was adopted for the output matching network using printed circuit board microstrips and discrete capacitors.

Figure 13:
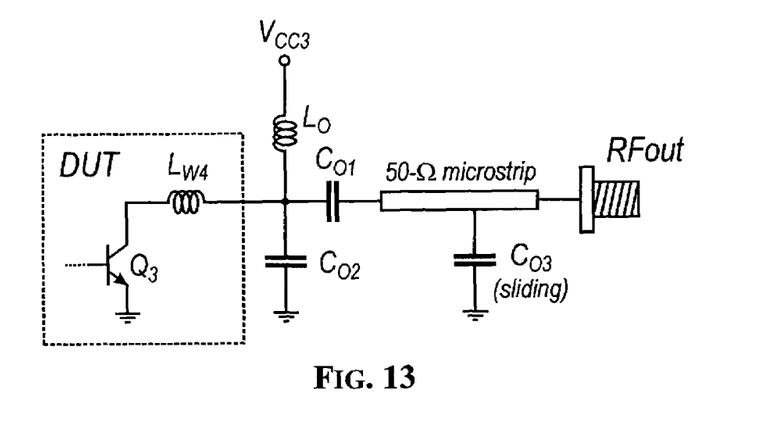
FIG. 13 shows the matching network at the PA output.

FIG. 13 outlines the scheme of the output matching network used for testing the circuit.

A reference power amplifier without protection circuitry was also integrated and characterized for performance comparison. The same testing conditions were applied both to the protected and nonprotected PA. The two circuits exhibited identical performance in terms of output power, gain and PAE under nominal bias and load conditions. This confirms that the loading effect of the sensing circuitry on the power transistor is negligible.

Figure 14:
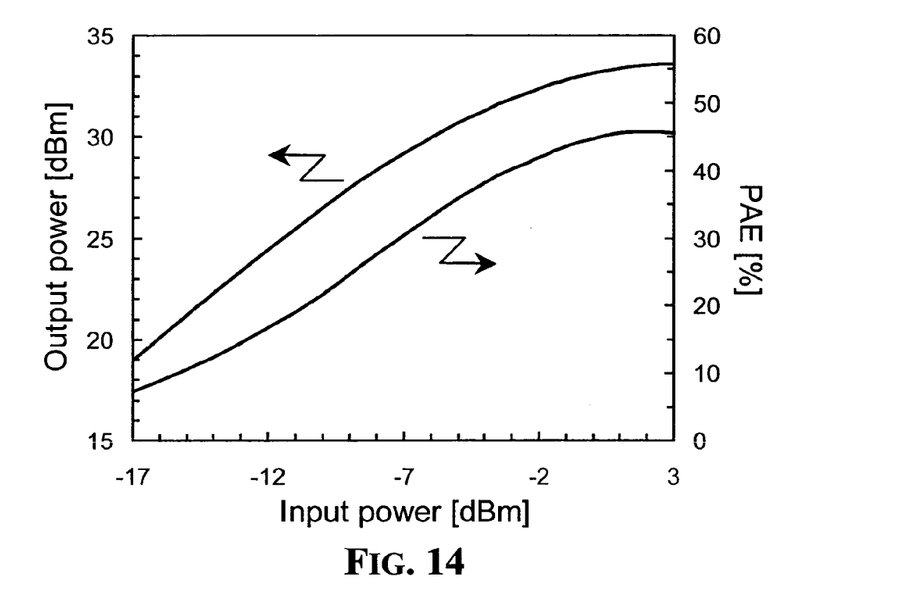
FIG. 14 shows output power and PAE characteristics versus input power ($V_{CC}$=3.5 V, $V_{CTRL}$=1.86 V, f=1.8 GHz, $T_{amb}$=30° C., pulsed mode test) according to the invention.

FIG. 14 shows the nominal performance of both PAs operating with a 50 Ω matched load at 1.8 GHz and 3.5 V supply voltage. They exhibited a 46% maximum PAE and 33.5 dBm saturated output power along with a 36 dB small-signal gain.

Figure 15:
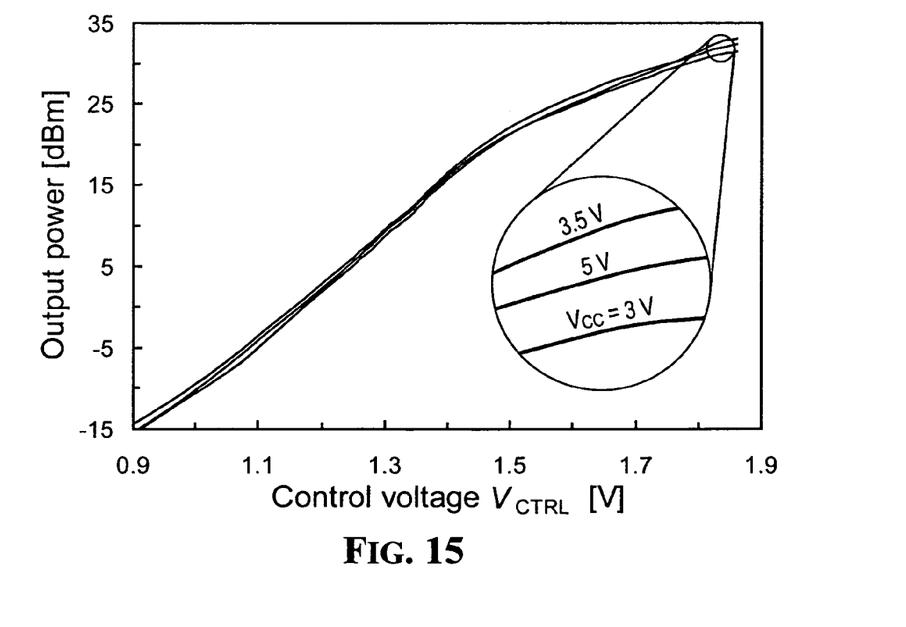
FIG. 15 shows output power versus control voltage ($V_{CTRL}$) characteristics under different supply voltages (f=1.8 GHz, $P_{in}$=0 dBm, $T_{amb}$=30° C., pulsed mode test) according to the invention.

FIG. 15 depicts the output power versus control voltage $V_{CTRL}$ characteristics at different supply voltage levels. The bias network allows a power control slope that is lower than 80 dB/V between −15 dBm and the saturated output power level.

Figure 16:
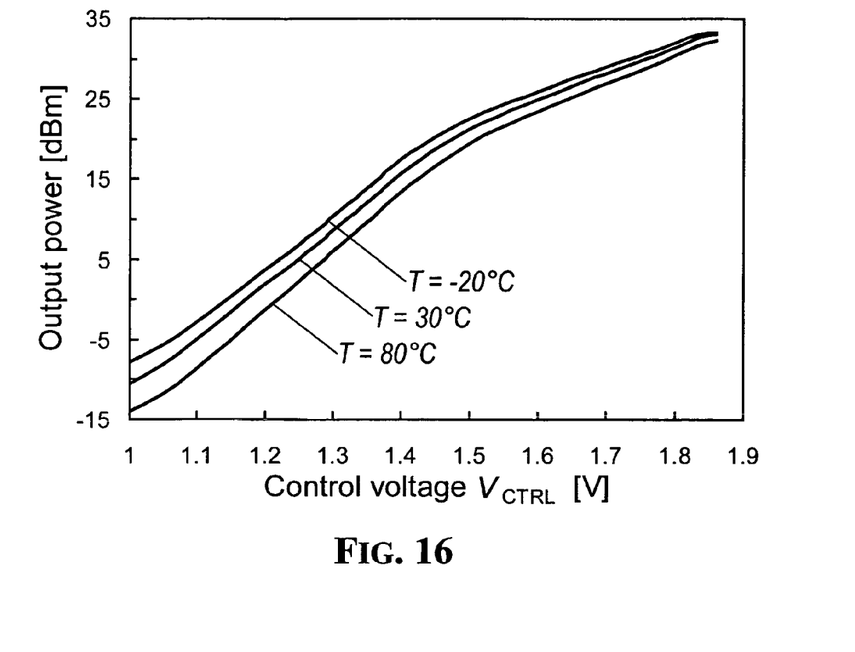
FIG. 16 shows output power versus control voltage ($V_{CTRL}$) characteristics at different operating temperatures ($V_{CC}$=3.5 V, f=1.8 GHz, $P_{in}$=0 dBm, pulsed mode test) according to the invention.

Moreover, measured gain variation with temperature is below ±3 dB between −20 and 80° C. within the same output power range, as shown in FIG. 16.

Figure 17:
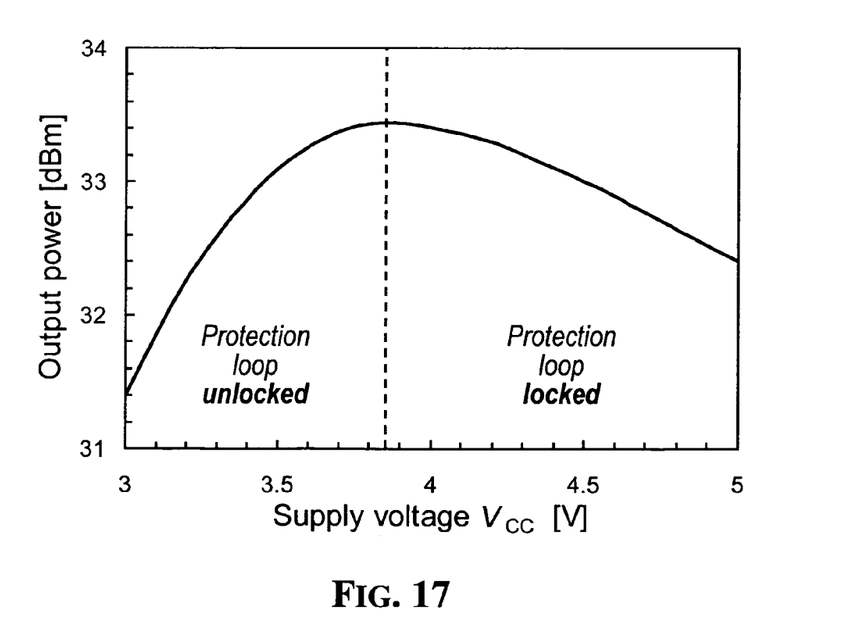
FIG. 17 shows output power versus supply voltage characteristics at the maximum gain setting ($V_{CTRL}$=1.86 V, f=1.8 GHz, $P_{in}$=0 dBm, $T_{amb}$=30° C., pulsed mode test) according to the invention.

It is worth mentioning that the output power is quite insensitive to supply voltage variations. Indeed, a lower than ±1 dB deviation was observed over the entire dynamic range with a supply voltage ranging from 3 to 5 V. At low power levels, such behavior can be ascribed to the supply-stable quiescent current set by the bias network. Conversely, at saturated output power levels, $P_{out}$ drift with $V_{CC}$ is compensated by the limiting effect of the VSWR-protection loop. Indeed, the feedback gradually reduces the amplitude of the fundamental tone to keep the collector peak voltage constant as $V_{CC}$ increases. Such a behavior is confirmed by FIG. 17, which shows the effect of loop locking on the power delivered (at maximum gain setting).

Ruggedness tests results are reported in the following table.

| Supply voltage [V] | With VSWR protection | Without VSWR protection |
|---|---|---|
| 3.5 | PASSED | PASSED |
| 3.9 | PASSED | PASSED |
| 4.3 | PASSED | FAILED |
| 4.7 | PASSED | FAILED |
| 5.1 | PASSED | FAILED |
| 5.3 | FAILED | FAILED |

Test conditions: 10:1 VSWR (all phases), f = 1.8 GHz, $P_{in}$ = 0 dBm, $T_{amb}$ = 30° C., $P_{out}$ = 33 dBm at 3.5 V (50 Ω), pulsed mode test PAs without VSWR protection were damaged by a 10:1 load VSWR under a 4.3 V supply voltage. The observed failure mechanism leads to an open-circuit condition for the collector of the final stage (i.e., no current flowing through the power transistor). By contrast, protected PAs revealed no damage up to 5.1 V (VSWR tests were carried out at all the load phase angles). Such excellent performance was achieved despite a relatively low $BV_{CEO}$ of 6.4 V. These results confirm the effectiveness of the circuit.

The transient response of the output voltage under load mismatch conditions was examined by a 6-GHz-bandwidth Agilent Infinium oscilloscope. The circuit was tested in pulsed-mode operation. A rise time of about 200 ns was observed and no overshoot was detected in the output voltage envelope. This is because the transient response of the RF chain (limited by supply filtering capacitors and chokes) is slower than the designed settling time of the control loop.

A 33.5 dBm output power, 46% PAE, and 36 dB gain were achieved at a nominal 3.5 V supply voltage. By the proposed bias network a lower than 80 dB/V power control slope was achieved between −15 dBm and the saturated output power level. Moreover, thanks to the protection circuit, the amplifier is able to sustain a load VSWR as high as 10:1 up to a 5.1 V supply voltage without exceeding the breakdown limits.

Other general references of interest, not already mentioned include the following:

[1] S. L. Wong, H. Bhimnathwala, S. Luo, B. Halali, and S. Navid, "A 1 W 830 MHz monolithic BiCMOS power amplifier," in *Int. Solid-State Circuits Conf. Tech. Dig.*, February 1996, pp. 52-54.

[2] D. Su and W. McFarland, "A 2.5 V, 1 W monolithic CMOS RF power amplifier," in *Proc. IEEE Custom Integrated Circuits Conf.*, May 1997, pp. 189-192.

[3] S. Weber and G. Donig, "An integrated 2 GHz 500 mW bipolar amplifier," in *IEEE RFIC Symp. Dig.*, June 1997, pp. 139-142.

[4] I. Yoshida et al., "A 3.6 V 4 W 0.2 cc Si power-MOS-amplifier module for GSM handset phones," in *Int. Solid-State Circuits Conf. Tech. Dig.*, February 1998, pp. 50-51.

[5] R. Parkhurst et al., "Silicon bipolar 3 V power amplifier for GSM900/GSM1800 handsets," in *Proc. IEEE Bipolar/BiCMOS Circuits Technol. Meeting*, September 1998, pp. 117-119.

[6] K.-C. Tsai and P. R. Gray, "A 1.9-GHz, 1-W CMOS class-E power amplifier for wireless communications," *IEEE J. Solid-State Circuits*, vol. 34, pp. 962-970, July 1999.

[7] C. Fallesen and P. Asbeck, "A 1 W 0.35 mΩ CMOS power amplifier for GSM-1800 with 45% PAE" in *Int. Solid-State Circuits Conf. Tech. Dig.*, February 2001, pp. 158-159.

[8] D. Heo, A. Sutono, E. Chen, Y. Suh, and J. Laskar, "A 1.9-GHz DECT CMOS power amplifier with fully integrated multilayer LTCC passives," *IEEE Microwave Wireless Components Lett.*, vol. 11, pp. 249-251, June 2001.

[9] W. Simburger, H.-D. Wohlmuth, P. Weger, and A. Heintz, "A monolithic transformer coupled 5-W silicon power amplifier with 59% PAE at 0.9 GHz," *IEEE J. Solid-State Circuits*, vol. 34, pp. 1881-1892, December 1999.

[10] W. Simbürger et al., "A monolithic 2.5 V, 1 W silicon bipolar amplifier with 55% PAE at 1.9 GHz," in *IEEE MTT-S Int. Microwave Symp. Dig.*, June 2000, pp. 853-856.

[11] T. Johansson, P. Lundin, J. Engvall, D. Uggla, and U. Hagström, "A high efficiency, low cost silicon bipolar GSM dual-band PA module," *Microwave J.*, vol. 44, no. 12, pp. 60-70, December 2001.

[12] K. L. R. Mertens and M. S. J. Steyaert, "A 700-MHz 1-W fully differential CMOS class-E power amplifier," *IEEE J. Solid-State Circuits*, vol. 37, pp. 137-141, February 2002.

[13] I. Aoki, S. D. Kee, D. B. Rutledge, and A. Hajimiri, "Fully integrated CMOS power amplifier design using the distributed active-transformer architecture," *IEEE J. Solid-State Circuits*, vol. 37, pp. 371-383, March 2002.

[14] F. Carrara, T. Biondi, A. Castorina, A. Scuderi, and G. Palmisano, "A 1.8-GHz high-efficiency 34-dBm silicon bipolar power amplifier," *IEEE Trans. Microwave Theory Tech.*, vol. 50, pp. 2963-2970, December 2002.

[15] T. Biondi, F. Carrara, A. Scuderi, and G. Palmisano, "A silicon bipolar technology for high-efficiency power applications up to C-band," in *IEEE RFIC Symp. Dig.*, June 2003, pp. 155-158.

[16] A. Scuderi, A. Scuderi, F. Carrara, and G. Palmisano, "VSWR-protected silicon bipolar power amplifier with smooth power control slope," in *Int. Solid-State Circuits Conf. Tech. Dig.*, February 2004, pp. 194-195.

That which is claimed is:

1. A method of controlling output power of an RF power amplifier comprising an output stage, the method comprising:

generating a signal proportional to an amplitude of an envelope of an output RF voltage sensed through an AC-coupled resistive voltage divider network;

comparing the generated signal with a reference threshold voltage and, when the reference threshold voltage is exceeded, controlling a gain of the RF power amplifier to protect the output stage; and setting the reference threshold voltage by an external regulating threshold voltage and internally modifying the external regulating threshold voltage as a function of a supply voltage to generate the reference threshold voltage compensated for supply voltage changes.

2. The method of claim 1, wherein comparing the generated signal with the reference threshold voltage is done by applying each to inputs of an error amplifier to output a current proportional to a difference therebetween.

3. The method of claim 2, further comprising modulating a gain of a current-starved driver stage of the RF power amplifier with the output current from the error amplifier by subtraction from a biasing current of the current-starved driver stage.

4. The method of claim 1, further comprising temperature compensating the reference threshold voltage.

5. A method of controlling an RF power amplifier comprising an output stage, the method comprising:

generating a signal based upon an envelope of a sensed output RF voltage;

comparing the generated signal with a reference threshold and, when the reference threshold is exceeded, controlling a gain of the RF power amplifier to protect the output stage; and setting the reference threshold based upon an external regulating threshold and so that the reference threshold is compensated for supply changes.

6. The method of claim 5, wherein generating the signal comprises generating the signal with an AC-coupled resistive voltage divider network.

7. The method of claim 5, wherein comparing the generated signal with the reference threshold is done by applying each to inputs of an error amplifier to output a current based upon a difference therebetween.

8. The method of claim 7, further comprising modulating a gain of a current-starved driver stage of the RF power amplifier with the output current from the error amplifier.

9. The method of claim 5, further comprising temperature compensating the reference threshold.

10. A control circuit for an output voltage of an output stage driven by a driver stage of an RF power amplifier, the control circuit comprising:

an AC-coupled output voltage sensing network having an output node;

an envelope amplitude detector circuit input with a replica of an RF output signal present on the output node of said AC-coupled output voltage sensing network;

an error amplifier for comparing an amplitude of an RF envelope signal output by said amplitude envelope detector with a reference threshold voltage, and outputting, when the reference threshold voltage is exceeded, a control current for an amplifier gain of the RF power amplifier to protect said output stage; and a reference threshold voltage generating circuit input with an external threshold regulating voltage and outputting the reference threshold voltage compensated for supply voltage changes.

11. The control circuit of claim 10, wherein the driver stage comprises a current-starved driver stage including a bias current generator having an output; and wherein an output of said error amplifier is coupled to the output of said bias current generator of the current-starved driver stage.

12. The control circuit of claim 10, wherein said reference threshold voltage generator is temperature compensated.

13. The control circuit of claim 10, wherein said error amplifier allows a locked loop only when a mismatch condition occurs on an output load.

14. An RF power amplifier comprising:
a driver stage;
an output stage driven by said driver stage; and
a control circuit comprising
an output voltage sensor having an output node,
an envelope amplitude detector circuit having an input coupled to the output node of said output voltage sensor,
an error amplifier for comparing an amplitude of an RF envelope signal output by said amplitude envelope detector with a reference threshold voltage, and outputting, when the reference threshold voltage is exceeded, a control current for an amplifier gain to protect said output stage, and
a reference threshold voltage generating circuit input with an external threshold regulating voltage and outputting the reference threshold voltage compensated for supply voltage changes.

15. The RF power amplifier of claim 14, wherein said output voltage sensor comprises an AC-coupled output voltage sensing network.

16. The RF power amplifier of claim 14, wherein said driver stage comprises a current-starved driver stage including a bias current generator having an output; and wherein an output of said error amplifier is coupled to the output of said bias current generator of said current-starved driver stage.

17. The RF power amplifier of claim 14, wherein said reference threshold voltage generator is temperature compensated.

18. The RF power amplifier of claim 14, wherein said error amplifier allows a locked loop only when a mismatch condition occurs on an output load.

* * * * *